US009258920B2

(12) United States Patent
    Arheit

(10) Patent No.: US 9,258,920 B2
(45) Date of Patent: Feb. 9, 2016

(54) DISPLAY ARRANGEMENT AND THE MOUNTING THEREOF

(76) Inventor: Thomas Arheit, Weingarten (DE)

( * ) Notice: Subject to any disclaimer, the term of this patent is extended or adjusted under 35 U.S.C. 154(b) by 481 days.

(21) Appl. No.: 13/636,103

(22) PCT Filed: Feb. 17, 2011

(86) PCT No.: PCT/EP2011/000758
§ 371 (c)(1),
(2), (4) Date: Dec. 3, 2012

(87) PCT Pub. No.: WO2011/116856
PCT Pub. Date: Sep. 29, 2011

(65) Prior Publication Data
US 2013/0070401 A1     Mar. 21, 2013

(30) Foreign Application Priority Data

Mar. 22, 2010  (DE) .......................... 10 2010 012 372
Sep. 29, 2010  (DE) .......................... 10 2010 046 874

(51) Int. Cl.
*G06F 1/16*     (2006.01)
*H05K 7/00*     (2006.01)
(Continued)

(52) U.S. Cl.
CPC ............ *H05K 7/00* (2013.01); *G02F 1/133308* (2013.01); *H05K 13/00* (2013.01);
(Continued)

(58) Field of Classification Search
CPC ... G06F 1/1601; G06F 1/1656; G06F 3/0416; G06F 1/1626; G06F 3/044; G06F 1/00; G06F 1/1605; G06F 1/1607; G06F 1/1613; G06F 1/1628; G06F 1/1633; G06F 1/1637; G06F 1/1671; G06F 1/169; G06F 1/1692; G06F 1/1694; G06F 1/1616; G06F 3/017; G06F 1/1615; G06F 1/162; G06F 1/1624; G06F 1/1635; G06F 1/1647; G06F 1/1649; G06F 1/1654; G06F 1/1675; G06F 1/181; H05K 5/0247; H05K 1/028; H05K 5/0004; H05K 5/0013; H05K 5/02; H05K 5/0221; H05K 5/061; H05K 7/18; H05K 5/0017; H05K 13/00; H05K 7/00; G02F 2001/133325; G02F 2001/133331; G02F 2201/46; G02F 1/133308; G02F 2001/133311; G02F 2001/133317; G02F 2001/133322; Y10T 29/49002
USPC ............ 361/679.02, 679.01, 679.27, 679.26, 361/679.21, 679.08, 679.09; 248/917–924; 29/592.1
See application file for complete search history.

(56) References Cited

U.S. PATENT DOCUMENTS 5,684,549 A     11/1997  Barth et al.
5,923,319 A  *   7/1999  Bishop et al. ................. 345/175
(Continued)

FOREIGN PATENT DOCUMENTS

CN    1188903         7/1998
CN    1450388 A      10/2003
(Continued)

OTHER PUBLICATIONS

International Search Report for application No. PCT/EP2011/000758 mailed Feb. 17, 2011.
(Continued)

*Primary Examiner* — Anthony Haughton
*Assistant Examiner* — Ingrid Wright
(74) *Attorney, Agent, or Firm* — Fletcher Yoder, P.C.

(57) ABSTRACT

The invention relates to a display arrangement and the mounting thereof.

10 Claims, 2 Drawing Sheets

(51) Int. Cl.
 *G02F 1/1333* (2006.01)
 *H05K 13/00* (2006.01)
(52) U.S. Cl.
 CPC .............. *G02F2001/133311* (2013.01); *G02F 2001/133314* (2013.01); *G02F 2001/133317* (2013.01); *G02F 2001/133322* (2013.01); *G02F 2001/133325* (2013.01); *G02F 2001/133331* (2013.01); *G02F 2201/46* (2013.01); *Y10T 29/49002* (2015.01)

(56) References Cited

U.S. PATENT DOCUMENTS

| | | | |
|---|---|---|---|
| 6,909,475 B2* | 6/2005 | Kojima et al. | 349/58 |
| 7,576,975 B2* | 8/2009 | Tai et al. | 361/679.21 |
| 7,936,413 B2* | 5/2011 | Jeong et al. | 349/58 |
| 2006/0209227 A1 | 9/2006 | Miyamoto | |
| 2007/0064378 A1 | 3/2007 | Lo et al. | |
| 2007/0121026 A1 | 5/2007 | Chang et al. | |
| 2007/0137082 A1 | 6/2007 | Omori et al. | |
| 2007/0273809 A1* | 11/2007 | Lee | 349/58 |
| 2010/0118480 A1* | 5/2010 | Lu et al. | 361/679.26 |
| 2011/0261285 A1* | 10/2011 | Wang | 349/60 |

FOREIGN PATENT DOCUMENTS

| | | |
|---|---|---|
| CN | 1808225 | 7/2006 |
| DE | 10316733 A1 | 10/2004 |
| EP | 0302189 A2 | 2/1989 |
| EP | 0695964 A2 | 2/1996 |
| JP | H06337411 A | 12/1994 |
| JP | H08179283 A | 7/1996 |
| JP | H1164860 A | 3/1999 |
| JP | 20013059985 A | 11/2001 |
| JP | 2002055629 A | 2/2002 |
| JP | 2004077955 A | 3/2004 |
| JP | 2006201364 A | 8/2006 |
| JP | 2007256518 A | 10/2007 |
| JP | 2007334244 A | 12/2007 |

OTHER PUBLICATIONS

German Office Action dated May 25, 2012; 6 pgs.
International Preliminary Report on Patentability mailed Sep. 25, 2012.
Japanese JP 2013-500352 Office Action dated Jul. 15, 2014; pp. 1-3.
Chinese Office Action mailed Aug. 22, 2014.

\* cited by examiner

DISPLAY ARRANGEMENT AND THE MOUNTING THEREOF

CROSS REFERENCE TO RELATED APPLICATIONS

This application claims priority from and the benefit of PCT Application No. PCT/EP2011/000758, filed on Feb. 17, 2011; German Patent No. DE 10 2010 012 372.2, filed on Mar. 22, 2010; and German Patent DE 10 2010 046 874.6, filed on Sep. 29, 2010; which are herein incorporated by reference.

BACKGROUND

The invention relates to a display arrangement and the mounting thereof.

It is known from the prior art how to position a TFT (Thin Film Transistor) display in relation to a carrier part by means of positioning elements in the form of screw boss/positioning pin combinations and to fix it by screw-fastening to the carrier part. A front cover subsequently mounted with a carrier part must then be positioned at a certain distance from the TFT display, in order to balance a thickness tolerance of the TFT display (approx. 0.3 mm) and prevent pressure from being exerted on the front of the TFT display. This crucial gap ultimately leads to difficulties in relation to the parallax, because although no pixels on the display are to be concealed, the frame of the TFT display should at the same time be out of sight from all observational angles.

The problem addressed by the invention is that of proposing a display arrangement and mounting thereof, which does not require a front pressure loading of the display unit and overcomes the previously described disadvantages of the prior art.

The problem is solved by a display arrangement with a display and a front part, wherein an intermediate part is provided between the front part and the display and the intermediate part is connected to the display in a frictionally engaged manner.

SUMMARY

The present invention relates to a display. This display may be any display with which the person skilled in the art is familiar, for example a TFT, LCD and/or OLED display.

Furthermore, the display according to the invention has a front part, wherein an intermediate part is provided between the front part and the display. This intermediate part may be used firstly to pre-fix the display to the front part and/or to connect the front part to the display.

It is anticipated according to the invention that the intermediate part is connected to the display in a frictionally engaged manner. The frictional engagement is preferably produced by pressing at least sections of the intermediate part against the display.

The intermediate part is therefore preferably a frame-like intermediate part, which is particularly preferably made of an elastic material, for example a rubber material and/or a foam material. This intermediate part is preferably elastically deformed during the assembly of the display arrangement and thereby pressed at least partially towards the display, which gives rise to the frictional engagement. Moreover, an elastic intermediate part has the advantage that comparatively crude production tolerances can be allowed. In a preferred embodiment, the intermediate part is also used as a seal, in order to prevent dirt and/or moisture from penetrating the display arrangement according to the invention.

The intermediate part preferably has at least one recess, with which a splaying means provided on the carrier part engages in a splaying manner. The splaying means, particularly the cross section thereof, is preferably greater in size than the cross section of the recess, at least in sections. The splaying means thereby splays/widens the recess. The splaying means preferably tapers from the carrier part to the tip of the splaying means. The splaying means is particularly preferably provided in wedge form. This splaying means brings about the elastic deformation of the intermediate part. The intermediate part is preferably clamped between the carrier part and the front part. The intermediate part preferably has a plurality of recesses, for which matching splaying means are arranged on the carrier part. The recesses are preferably provided symmetrically relative to a center axis.

In a preferred embodiment, the display arrangement has a front glass.

The front glass is preferably connected to the display, particularly in a substance-bonded manner. An optical adhesive is particularly suitable for this adhesive bond.

The front part of the display arrangement is preferably provided with a cover. A front glass is preferably arranged on this cover.

A further object of the present invention is a method of mounting the display arrangement according to the invention, in which the display is laid in the front part and connected to the intermediate part in a frictionally engaged manner.

The comments made in relation to the display arrangement according to the invention apply equally to the method according to the invention and vice versa.

The intermediate part is preferably at least partially deformed by a carrier part. Furthermore, the carrier part is preferably connected to the front part. In particular, this interconnection is made by a screw closure or snap fit, quite particularly preferably in a toolless manner. The splaying elements in this case may be used as limiting means, so that the intermediate part does not become too deformed.

One aspect of the invention therefore particularly involves an intermediate part being arranged in an intermediate space created between two first components, said intermediate part guaranteeing a pre-positioning between the first two components relative to one another, for example. At least one area of the intermediate part is formed from an elastically yielding material, while a further, second component is provided with at least one comparatively dimensionally stable press-fit tool. When the individual components are assembled into the unit as a display arrangement, the elastically yielding area is deformed by the press-fit tool and thereby pressed against a surface of one of the first components.

DRAWINGS

The invention is explained below with the help of FIGS. 1-3. These explanations are only by way of example and do not restrict the general basic idea underlying the invention. The explanations apply to both objects of the present invention equally.

DETAILED DESCRIPTION

In the following figures identical components and elements are provided with the same reference numbers.

Figure 1:
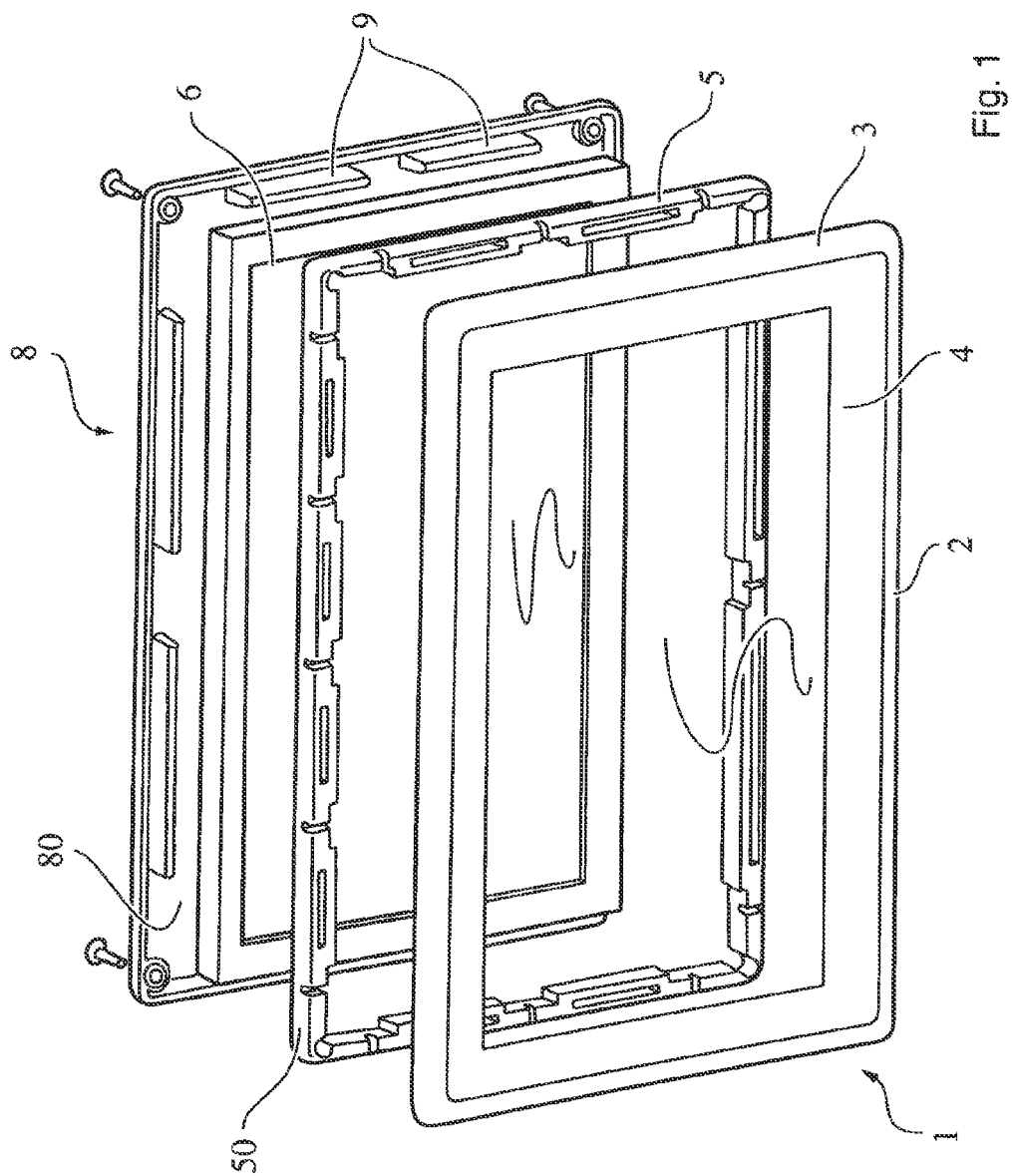
FIG. 1 shows a display arrangement according to the invention in an exploded view.

The display arrangement 1 according to the invention shown as an exploded view in FIG. 1 is disposed in a vehicle cockpit, for example. The display arrangement 1 is delimited at the front by a front part 2, which comprises a front cover 3 with an integrated front glass 4. An intermediate part 5, which is produced from an elastically yielding material (e.g. rubber, silicone, thermoplastic elastomer and/or foam), exhibits a frame-like geometric configuration. The display arrangement 1 further comprises a display, in this case a TFT display 6.

On a front surface 50 of the intermediate part 5 which is forward-facing in the mounted state, openings 7 (only some of which are assigned a reference number) open out into the space. The openings 7 are arranged at regular intervals to one another over the entire periphery of the front face 50, wherein another arrangement is also possible.

A carrier part 8 is disposed behind the display 6, which has a flat, plate-like base body 80 bounding the display arrangement 1 rearwardly. The base body 80 is provided with press-fit wedges 9 (only some of which are assigned a reference number) aligned with the openings 7 on the edge. The press-fit wedges 9 are distributed around the entire peripheral edge of the base body 80.

Figure 2:
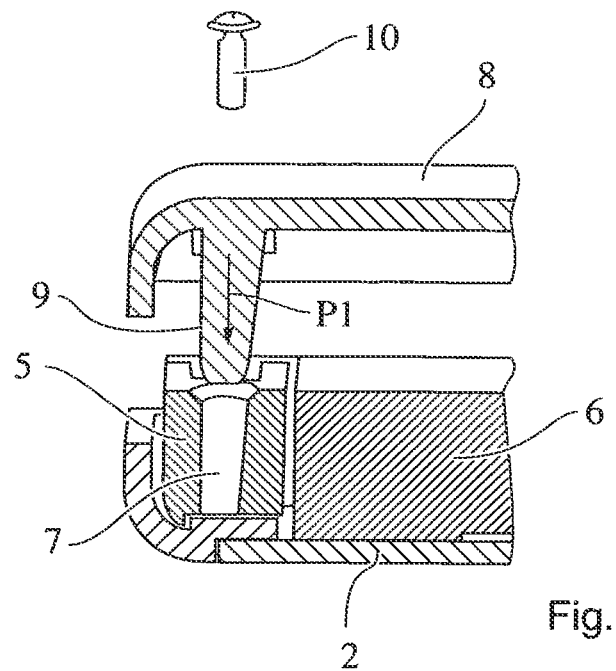
FIG. 2 shows a detail of the display arrangement from FIG. 1 at an earlier stage in the assembly of the display arrangement as a sectional view.

When the individual components are assembled into the finished display arrangement 1, the display 6 is first introduced or laid into the front part 2 from the rear side, such that it fits closely, i.e. at least virtually gap-free, against the front part 2. In the intermediate space created between the display 6 and the front part 2, particularly the intermediate space between the outer periphery of the display and the inner periphery of the front part, the intermediate part 5 is inserted or laid in for prepositioning purposes. In the further course of the display arrangement assembly, there is then a convergence of the carrier part 8 with the front part 2 or with the intermediate part 5. This convergence is indicated in FIG. 2, which shows a detail of the display arrangement 1 from FIG. 1 at the relevant time of assembly, by a first arrow P1.

The press-fit wedges 9 are aligned with the openings 7, such that during a phase of the convergence of the carrier part 8 with the front part 2, the press-fit wedges 9 each engage with at least one opening 7 in the intermediate part 5.

Due to the broadening wedge shape of the press-fit wedges 9, as the convergence of the carrier part 8 with the front part 2 progresses, the intermediate part 5 is increasingly elastically deformed in the areas concerned around the openings 7 and the thereby displaced and the inner periphery of the intermediate part 5 pressed against a surface of the display 6, particularly against the outer periphery thereof, at least in sections.

Figure 3:
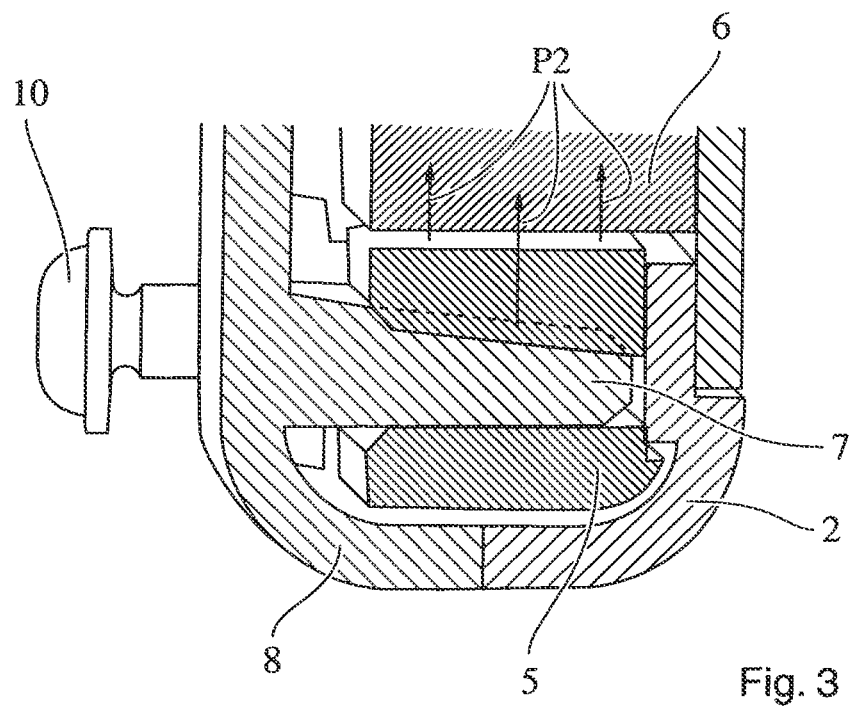
FIG. 3 shows the representation from FIG. 2 at a later stage in the assembly of the display arrangement.

FIG. 3 shows the representation from FIG. 2 at a later stage in the assembly of the display arrangement 1 compared with FIG. 2. The press-fit wedges 9 have now penetrated deep into the openings 7.

The direction of the material deformation referred to, which at the same time represents the direction of the contact force of the displaced material into the display 6, is indicated by second arrows P2.

When the press-fit wedges 9 have reached their defined final position, they ultimately cause the display 6 to be jammed in the front part 2 and therefore said display 6 to be fixed by means of friction. The front part 2 is then secured to or clipped onto the carrier part 8 by means of screws 10.

The individual opening/press-fit wedge combinations are coordinated with one another; in particular, the deformations at the different points occur simultaneously, which means that a symmetrical positioning of the display 6 is achieved.

It is also possible to attach the front glass to the display (for example by adhering with an optical adhesive, etc.) and then arrange the resulting composite component comprising the display and front glass such that the front glass is arranged flush with the front side of the front cover. In this case too, fixing takes place according to the previously described principle by means of an elastic deformation of an intermediate part, which is located between the front cover and the display.

The result is that a new way of positioning and fixing a display has been shown, in which an alignment of the display relative to the front cover takes place.

For the positioning and fixing of a display according to the invention, screw bosses and pins on the rear side of the TFT can be dispensed with.

The intermediate part 5 may be designed such that in addition it performs the function of a seal to prevent an inner area of the display arrangement 1 from being penetrated by dirt from outside.

Although the invention has been explained with an example of a TFT display, this should not be regarded as limitative. Rather, the invention may also be used on a display of another type, rather than on a TFT display, such as a luminescence or plasma display, LCD (Liquid Crystal Display), OLED (Organic Light-Emitting Diode), etc.

The invention claimed is:

1. A display arrangement comprising:
    a display;
    a front part;
    an intermediate part between the front part and the display, wherein the intermediate part comprises an elastic material and at least one recess, and the intermediate part has a frame-like shape; and
    a carrier part comprising at least one splaying element having a wedge shape and configured to engage the at least one recess in a splaying manner, wherein the at least one splaying element is configured to induce an elastic deformation of the intermediate part toward the display in a material deformation direction upon engagement of the at least one splaying element with the at least one recess, and the intermediate part is configured to apply a contact force against a peripheral surface of the display in the material deformation direction in response to the elastic deformation to connect the intermediate part to the display in a frictionally engaged manner.

2. The display arrangement as claimed in claim 1, comprising a front glass.

3. The display arrangement as claimed in claim 2, wherein the front glass is connected to the display.

4. The display arrangement as claimed in claim 3, wherein the front glass is connected to the display in a substance-bonded manner.

5. The display arrangement as claimed in claim 1, wherein the front part has a cover.

6. The display arrangement as claimed in claim 5, wherein the front glass is arranged at the cover.

7. A method of mounting a display arrangement comprising:
    positioning a frame-like intermediate part between a front part and a display, wherein the frame-like intermediate part comprises an elastic material and at least one recess;
    aligning at least one wedge-shaped splaying element of a carrier part with the at least one recess; and engaging the at least one wedge-shaped splaying element with the at least one recess in a splaying manner to induce an elastic deformation of the frame-like intermediate part toward the display in a material deformation direction, wherein the elastic deformation induces the frame-like intermediate part to apply a contact force against a peripheral surface of the display in the material deformation direction to connect the frame-like intermediate part to the display in a frictionally engaged manner.

8. The method as claimed in claim 7, comprising coupling the front part to the carrier part.

9. The method as claimed in claim 7, comprising coupling the front part to the carrier part via one or more fasteners.

10. The method as claimed in claim 7, comprising placing the display into contact with the front part.

* * * * *